US012620344B2

(12) United States Patent
Ke et al.

(10) Patent No.: US 12,620,344 B2
(45) Date of Patent: May 5, 2026

(54) DISPLAY PANEL AND DISPLAY DEVICE

(71) Applicant: Xiamen Tianma Display Technology Co., Ltd., Xiamen (CN)

(72) Inventors: Zhoulin Ke, Xiamen (CN); Cheng Hu, Xiamen (CN)

(73) Assignee: Xiamen Tianma Display Technology Co., Ltd., Xiamen (CN)

( * ) Notice: Subject to any disclaimer, the term of this patent is extended or adjusted under 35 U.S.C. 154(b) by 0 days.

(21) Appl. No.: 18/805,968

(22) Filed: Aug. 15, 2024

(65) Prior Publication Data

US 2024/0404459 A1 Dec. 5, 2024

(30) Foreign Application Priority Data

Aug. 28, 2023 (CN) .......................... 202311092570.3

(51) Int. Cl.
*G09G 3/32* (2016.01)
*G09G 3/3225* (2016.01)
*G09G 3/3266* (2016.01)
*G11C 19/28* (2006.01)

(52) U.S. Cl.
CPC ............. *G09G 3/32* (2013.01); *G09G 3/3225* (2013.01); *G09G 3/3266* (2013.01); *G11C 19/28* (2013.01); *G09G 2310/0286* (2013.01); *G09G 2310/08* (2013.01)

(58) Field of Classification Search
CPC .. G11C 19/28; G09G 2310/0286; G09G 3/32; G09G 3/3225; G09G 3/3266
See application file for complete search history.

(56) References Cited

U.S. PATENT DOCUMENTS

| | | | |
|---|---|---|---|
| 2020/0251044 A1* | 8/2020 | Lin .................... | H03K 19/0019 |
| 2022/0392403 A1* | 12/2022 | Yamamoto ............. | G11C 19/28 |
| 2023/0162684 A1* | 5/2023 | Lu .......................... | G11C 19/28 |
| | | | 345/204 |
| 2023/0298509 A1* | 9/2023 | Liu ...................... | G09G 3/3266 |
| | | | 345/55 |
| 2024/0371329 A1* | 11/2024 | Liu ...................... | G09G 3/3233 |
| 2025/0006284 A1* | 1/2025 | Huang ................... | G11C 19/28 |

FOREIGN PATENT DOCUMENTS

CN          111145678 A      5/2020

* cited by examiner

*Primary Examiner* — Xuemei Zheng
(74) *Attorney, Agent, or Firm* — KDW Firm PLLC

(57) ABSTRACT

Provided are a display panel and a display device. The display panel includes first shift registers. A first shift register includes a node control module, a first control module, a first output module and a second output module. The node control module is configured to control a potential of the first node and a potential of the second node. The first control module is connected between the first node and a third node. The first output module is connected between a first power supply terminal and an output signal terminal. The second output module is connected between a second power supply terminal and the output signal terminal. In a first output stage, the first output module is turned on, the second output module is turned off and the first control module is turned off.

21 Claims, 7 Drawing Sheets

DISPLAY PANEL AND DISPLAY DEVICE

CROSS-REFERENCE TO RELATED APPLICATIONS

This application claims priority to Chinese patent application No. 202311092570.3 filed with the China National Intellectual Property Administration (CNIPA) on Aug. 28, 2023, the disclosure of which is incorporated herein by reference in its entirety.

TECHNICAL FIELD

The present disclosure relates to the field of display technology and, in particular, a display panel and a display device.

BACKGROUND

In a display device, a shift register is generally used for driving pixel circuits in the display region.

With the rapid development of display technology, users have increasingly high requirements for the display effect of a display panel, followed by higher requirements for the driving and control capability of the shift register.

However, the output signal of the existing shift register is unstable, which affects the display effect of the display device.

SUMMARY

The present disclosure provides a display panel and a display device to solve the problem of unstable output of the existing shift register.

According to one aspect of the present disclosure, a display panel is provided. The display panel includes first shift registers.

A first shift register comprises a node control module, a first control module, a first output module and a second output module.

The node control module is connected to a first signal terminal, a first clock signal terminal, a first node and a second node and is configured to control a potential of the first node and a potential of the second node.

A control terminal of the first control module is connected to a second signal terminal, and the first control module is connected between the first node and a third node.

A control terminal of the first output module is connected to the third node, and the first output module is connected between a first power supply terminal and an output signal terminal.

A control terminal of the second output module is connected to the second node, and the second output module is connected between a second power supply terminal and the output signal terminal.

A working stage of the first shift register includes a first output stage.

In the first output stage, the node control module adjusts the potential of the first node and the potential of the second node so that the first output module is turned on, the second output module is turned off and the first control module is turned off.

According to another aspect of the present disclosure, a display device is provided. The display device includes the display panel described above.

It is to be understood that the content described in this section is neither intended to identify key or critical features of the embodiments of the present disclosure nor intended to limit the scope of the present disclosure. Other features of the present disclosure become easily understood through the description hereinafter.

BRIEF DESCRIPTION OF DRAWINGS

To illustrate technical solutions in embodiments of the present disclosure more clearly, drawings used in the description of the embodiments are briefly described below. Apparently, the drawings described below only illustrate part of the embodiments of the present disclosure, and those of ordinary skill in the art may obtain other drawings based on the drawings on the premise that no creative work is done.

DETAILED DESCRIPTION

To make technical solutions of the present disclosure be better understood by those skilled in the art, the technical solutions in embodiments of the present disclosure are described below clearly and completely in conjunction with drawings in the embodiments of the present disclosure. Apparently, the embodiments described below are part, not all, of the embodiments of the present disclosure. Based on the embodiments of the present disclosure, all other embodiments obtained by those of ordinary skill in the art on the premise that no creative work is done are within the scope of the present disclosure.

It is to be noted that terms "first", "second" and the like in the description, claims and drawings of the present disclosure are used for distinguishing between similar objects and are not necessarily used for describing a particular order or sequence. It is to be understood that the data used in this manner is interchangeable in appropriate cases so that the embodiments of the present disclosure described herein can be implemented in an order not illustrated or described herein. In addition, terms "comprising", "including" and any other variation thereof are intended to encompass a non-exclusive inclusion. For example, a process, method, system, product or device that includes a series of steps or units not only includes the expressly listed steps or units, but may also include other steps or units that are not expressly listed or are inherent to such a process, method, product or device.

Figure 1:
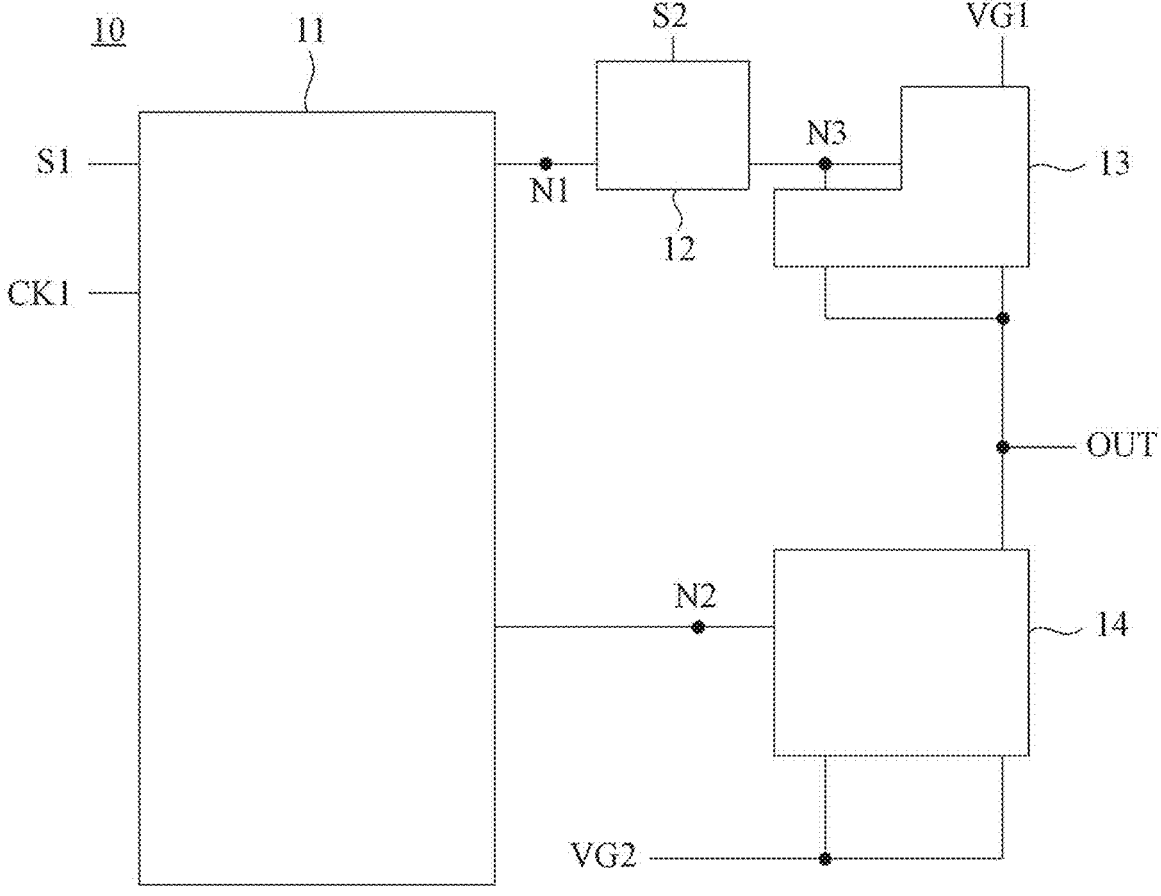
FIG. 1 is a diagram of a first shift register according to an embodiment of the present disclosure.

FIG. 1 is a diagram of a first shift register according to an embodiment of the present disclosure. The embodiment is applicable to the case of driving a display panel. As shown in FIG. 1, the display panel includes first shift registers 10. A first shift register 10 includes a node control module 11, a first control module 12, a first output module 13 and a second output module 14. The node control module 11 is connected to a first signal terminal S1, a first clock signal terminal CK1, a first node N1 and a second node N2, and the node control module 11 is configured to control a potential of the first node N1 and a potential of the second node N2. A control terminal of the first control module 12 is connected to a second signal terminal S2, and the first control module 12 is connected between the first node N1 and a third node N3. A control terminal of the first output module 13 is connected to the third node N3, and the first output module 13 is connected between a first power supply terminal VG1 and an output signal terminal OUT. A control terminal of the second output module 14 is connected to the second node N2, and the second output module 14 is connected between a second power supply terminal VG2 and the output signal terminal OUT. A working stage of the first shift register 10 includes a first output stage. In the first output stage, the node control module 11 adjusts the potential of the first node N1 and the potential of the second node N2 so that the first output module 13 is turned on, the second output module 14 is turned off and the first control module 12 is turned off. In an embodiment, the working stage of the first shift register 10 further includes a second output stage. In the second output stage, the node control module 11 adjusts the potential of the first node N1 and the potential of the second node N2 so that the first output module 13 is turned off and the second output module 14 is turned on.

Figure 2:
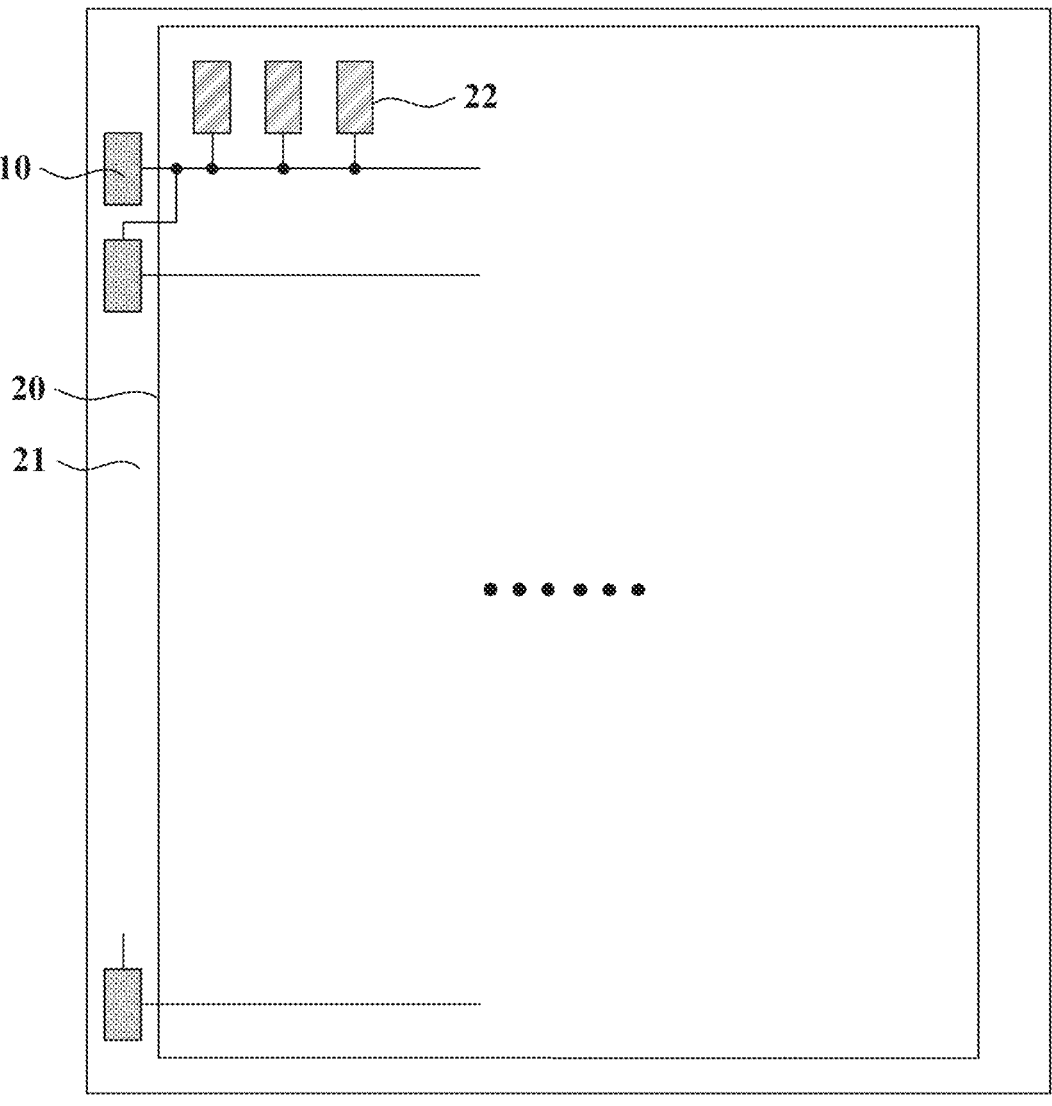
FIG. 2 is a diagram of a display panel according to an embodiment of the present disclosure.

FIG. 2 is a diagram of a display panel according to an embodiment of the present disclosure. As shown in FIG. 2, the display panel includes a display region 20 and a non-display region 21. The display region 20 includes multiple subpixels 22. In an embodiment, the multiple subpixels 22 are arranged in an array, but the arrangement manner of the subpixels 22 in the display region 20 is not limited to the array arrangement manner and may also be another arrangement manner, which is not repeated here. Circuit structures such as peripheral lines are disposed in the non-display region 21 for driving the subpixels 22 in the display region 20 to display. The non-display region 21 includes first shift registers 10. The output signal terminal of a first shift register 10 is connected to one or more rows of subpixels 22. The first shift register 10 provides a scan signal for the corresponding subpixels 22 connected to the first shift register to drive the subpixels 22 to display. It is to be understood that the non-display region 21 includes multiple different driver circuits, and at least one of the driver circuits includes multiple first shift registers 10. The connection manner or the number of first shift registers 10 may be different in different driver circuits, and the signal output by the output signal terminal of the first shift register 10 may be different in different driver circuits, which are not repeated here.

In the embodiment, the first shift register 10 includes the node control module 11. The node control module 11 is connected to the first signal terminal S1, the first clock signal terminal CK1, the first node N1 and the second node N2. The node control module 11 receives a first signal provided by the first signal terminal S1 and receives a first clock signal provided by the first clock signal terminal CK1. The node control module 11 controls the potential of the first node N1 and the potential of the second node N2 in response to the first signal and the first clock signal. In the working process of the first shift register 10, the first signal switches between a high level and a low level, and the first clock signal switches between a high level and a low level. If the first signal and the first clock signal are changed, in response to the first signal and the first clock signal, the node control module 11 controls the signal of the first node N1 to be a low level or a high level and also controls the signal of the second node N2 to be a low level or a high level. In response to the signal of the first signal terminal S1 and the signal of the first clock signal terminal CK1, the node control module 11 controls the signal of the first node N1 and the signal of the second node N2, so that the stability of both the signal of the first node N1 and the signal of the second node N2 is ensured.

The first shift register 10 includes the first control module 12. The control terminal of the first control module 12 is connected to the second signal terminal S2, and the first control module 12 is connected between the first node N1 and the third node N3. A second signal provided by the second signal terminal S2 controls the first control module 12 to be turned on or off. When the first control module 12 is turned on, the transmission path between the first node N1 and the third node N3 conducts. If the potential of the first node N1 is a low level, the potential of the third node N3 is pulled down as a low level; and if the potential of the first node N1 is a high level, the potential of the third node N3 is pulled up as a high level. When the first control module 12 is turned off, the transmission path between the first node N1 and the third node N3 is disconnected. The switching between a high level and a low level of the first node N1 does not affect the potential of the third node N3 so that the stability of the signal of the third node N3 is ensured.

The first shift register 10 includes the first output module 13. The control terminal of the first output module 13 is connected to the third node N3, and the first output module 13 is connected between the first power supply terminal VG1 and the output signal terminal OUT. A signal of the third node N3 controls the first output module 13 to be turned on or off. When the first output module 13 is turned on, the transmission path between the first power supply terminal VG1 and the output signal terminal OUT conducts; a first power supply signal provided by the first power supply terminal VG1 is transmitted to the output signal terminal OUT. When the first output module 13 is turned off, the transmission path between the first power supply terminal VG1 and the output signal terminal OUT is disconnected. It is to be understood that the first power supply signal provided by the first power supply terminal VG1 is a constant voltage signal, and no switching between a high level and a low level occurs. When the first control module 12 is turned off, the potential of the third node N3 is stable, the stability of the on/off state of the first output module 13 is ensured, and it is avoided that the first output module 13 is abnormally turned on or off due to an effect on the third node N3 caused by the signal switching of the first node N1 between a high level and a low level.

The first shift register 10 includes the second output module 14. The control terminal of the second output module 14 is connected to the second node N2, and the second output module 14 is connected between the second power supply terminal VG2 and the output signal terminal OUT. The potential of the second node N2 controls the second output module 14 to be turned on or off. When the second output module 14 is turned on, the transmission path between the second power supply terminal VG2 and the output signal terminal OUT conducts, and a second power supply signal provided by the second power supply terminal VG2 is transmitted to the output signal terminal OUT. When the second output module 14 is turned off, the transmission path between the second power supply terminal VG2 and the output signal terminal OUT is disconnected. It is to be understood that the second power supply signal provided by the second power supply terminal VG2 is a constant voltage signal, and no switching between a high level and a low level occurs.

The first power supply signal provided by the first power supply terminal VG1 is different from the second power supply signal provided by the second power supply terminal VG2. On the premise that the first shift register 10 normally works, the first power supply signal provided by the first power supply terminal VG1 may be a low-level signal, and correspondingly, the second power supply signal provided by the second power supply terminal VG2 is a high-level signal; alternatively, the first power supply signal provided by the first power supply terminal VG1 may be a high-level signal, and correspondingly, the second power supply signal provided by the second power supply terminal VG2 is a low-level signal. The high-level signal and the low-level signal provided by the first power supply terminal VG1 and the second power supply terminal VG2 may cause the output signal of the output signal terminal OUT of the first shift register 10 to switch between a high level and a low level. The high-level signal and the low-level signal can control the on/off state of a function module in the subpixel 22.

In one or more embodiments, the signal output by the first shift register 10 is used for controlling the on/off state of a reset module in the subpixel 22. In this case, if the output signal terminal OUT of the first shift register 10 is at a high level, the reset module in the subpixel 22 is controlled to be turned on, and correspondingly, when the output signal terminal OUT of the first shift register 10 is at a low level, the reset module in the subpixel 22 is controlled to be turned off; alternatively, if the output signal terminal OUT of the first shift register 10 is at a low level, the reset module in the subpixel 22 is controlled to be turned on, and correspondingly, when the output signal terminal OUT of the first shift register 10 is at a high level, the reset module in the subpixel 22 is controlled to be turned off.

The working stage of the first shift register 10 includes the first output stage. In the first output stage, the node control module 11 adjusts the potential of the first node N1 and the potential of the second node N2 so that the first output module 13 is turned on, the second output module 14 is turned off and the first control module 12 is turned off. The first control module 12 is turned off so that the signal switching of the first node N1 between a high level and a low level does not affect the potential of the third node N3. In this manner, the stability of the signal of the third node N3 is ensured, the third node N3 can stably control the first output module 13 to be turned on, the transmission path between the first power supply terminal VG1 and the output signal terminal OUT is kept conductive, and thus the output stability of the first output stage is improved without abnormal disconnection of the first output module 13.

The working stage of the first shift register 10 further includes the second output stage. In the second output stage, the node control module 11 adjusts the potential of the first node N1 and the potential of the second node N2 so that the first output module 13 is turned off and the second output module 14 is turned on. The node control module 11 adjusts the potential of the second node N2 so that the second output module 14 is turned on, and adjusts the potential of the third node N3 so that the first output module 13 is turned off. The signal of the second node N2 is stable so that the second node N2 can stably control the second output module 14 to be turned on, the transmission path between the second power supply terminal VG2 and the output signal terminal OUT is kept conductive, and thus the output stability of the second output stage is improved without abnormal disconnection of the second output module 14.

The preceding is the core idea of the present disclosure. To make the preceding objects, features and advantages of the present disclosure more understandable, the technical solutions in the embodiments of the present disclosure are described clearly and completely below in conjunction with the drawings in the embodiments of the present disclosure. Apparently, the embodiments described below are some embodiments, not all embodiments, of the present disclosure.

In the present disclosure, the control terminal of the first control module is connected to the second signal terminal, and the on/off state of the first control module can be effectively controlled by controlling the magnitude of the signal of the second signal terminal. In the first output stage, the signal of the second signal terminal is adjusted so that the first control module is controlled to be stabilized at the off state. Even if current leakage and threshold voltage drift occur on the first control module, the off state can control the current leakage of the first control module to a relatively low level. Therefore, the impact of the current leakage and the threshold voltage drift of the first control module on the third node is effectively reduced so that the potential of the third node is almost not raised or the raising amount of the potential of the third node is slight, and thus the on/off state of the first output module is not affected. In this manner, the stability of the output signal of the first shift register in the first output stage is ensured under different driving states such as a low-frequency driving state or a high-frequency driving state, thus improving the display effect.

Figure 3:
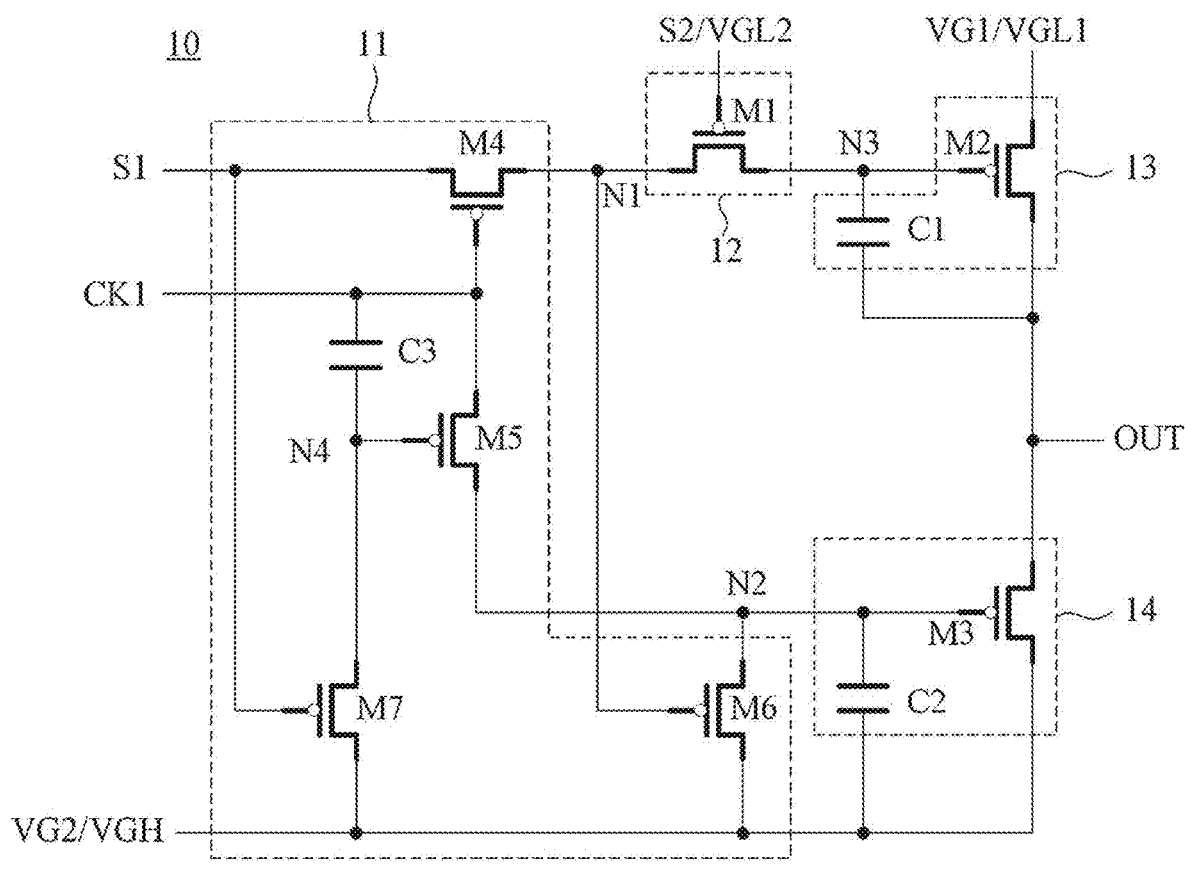
FIG. 3 is a diagram of another first shift register according to an embodiment of the present disclosure.

FIG. 3 is a diagram of another first shift register according to an embodiment of the present disclosure. As shown in FIG. 3, the first control module 12 may include a first transistor M1. A gate of the first transistor M1 is connected to the second signal terminal S2, and the first transistor M1 is connected between the first node N1 and the third node N3. In an embodiment, the first output module 13 includes a second transistor M2 and a first capacitor C1. A gate of the second transistor M2 is connected to the third node N3, and the second transistor M2 is connected between the first power supply terminal VG1 and the output signal terminal OUT. The first capacitor C1 is coupled between the third node N3 and the output signal terminal OUT. In an embodiment, the second output module 14 includes a third transistor M3 and a second capacitor C2. A gate of the third transistor M3 is connected to the second node N2, and the third transistor M3 is connected between the second power supply terminal VG2 and the output signal terminal OUT. The second capacitor C2 is coupled between the second node N2 and the second power supply terminal VG2. In an embodiment, the node control module 11 includes a fourth transistor M4. A gate of the fourth transistor M4 is connected to the first clock signal terminal CK1, and the fourth transistor M4 is connected between the first signal terminal S1 and the first node N1. The first signal terminal S1 provides signals alternating between a high level and a low level.

In one or more embodiments, the node control module 11 further includes a fifth transistor M5, a sixth transistor M6, a seventh transistor M7 and a third capacitor C3. A gate of the fifth transistor M5 is connected to the first clock signal terminal CK1 through the third capacitor C3, and the fifth transistor M5 is connected between the gate of the fourth transistor M4 and the second node N2. A gate of the sixth transistor M6 is connected to the first node N1, and the sixth transistor M6 is connected between the second node N2 and the second power supply terminal VG2. A gate of the seventh transistor M7 is connected to the first signal terminal S1, and the seventh transistor M7 is connected between the gate of the fifth transistor M5 and the second power supply terminal VG2.

In one or more embodiments, the first shift register 10 includes at least one transistor, and the at least one transistor is a low-temperature polycrystalline silicon (LTPS) transistor.

In the embodiment, the first transistor M1 to the seventh transistor M7 in the first shift register 10 are all P-type transistors. The first transistor M1 to the seventh transistor M7 in the first shift register 10 are all LTPS thin-film transistors (TFTs), but are not limited to LTPS-TFTs. In other embodiments, one or more transistors in the first shift register may be N-type transistors, such as indium gallium zinc oxide (IGZO)-TFTs. Alternatively, all transistors in the first shift register may be N-type transistors. The relevant staff may reasonably design the switch types of the transistors in the first shift register according to product requirements. It is to be noted that the structure of the first shift register is not limited to the case of the 7T3C structure shown in FIG. 3, various different structures of the shift register such as 10T2C structure and 8T3C structure all fall within the protection scope of the present disclosure, and no example or explanation is repeated herein.

On this basis, when the signal of the second signal terminal S2 is a low level, the first transistor M1 is turned on; or when the signal of the second signal terminal S2 is a high level, the first transistor M1 is turned off. When the signal of the third node N3 is a low level, the second transistor M2 is turned on; or when the signal of the third node N3 is a high level, the second transistor M2 is turned off. When the signal of the second node N2 is a low level, the third transistor M3 is turned on; or when the signal of the second node N2 is a high level, the third transistor M3 is turned off. When the signal of the first clock signal terminal CK1 is a low level, the fourth transistor M4 and the fifth transistor M5 are all turned on; or when the signal of the first clock signal terminal CK1 is a high level, the fourth transistor M4 and the fifth transistor M5 are turned off. When the signal of the first node N1 is a low level, the sixth transistor M6 is turned on; or when the signal of the first node N1 is a high level, the sixth transistor M6 is turned off. When the signal of the first signal terminal S1 is a low level, the seventh transistor M7 is turned on; or when the signal of the first signal terminal S1 is a high level, the seventh transistor M7 is turned off.

In one or more embodiments, the first power supply terminal VG1 provides a low-level signal VGL1 and the second power supply terminal VG2 provides a high-level signal VGH. In an embodiment, the voltage signal provided by the second signal terminal S2 is different from the voltage signal provided by the first power supply terminal VG1. In an embodiment, the first power supply terminal VG1 provides a first low-level signal VGL1, the second signal terminal S2 provides a second low-level signal VGL2, and the first low-level signal VGL1 is not equal to the second low-level signal VL2. In an embodiment, the first low-level signal VGL1 is lower than the second low-level signal VL2. It is to be understood that if the switch type of one or more transistors in the first shift register is changed, or if the circuit structure of the first shift register is changed, voltage signals provided by the first power supply terminal, the second power supply terminal and the second signal terminal may be changed. Exemplarily, the first power supply terminal provides a high-level signal, the second power supply terminal provides a low-level signal, and the second signal terminal provides a voltage signal higher than the signal provided by the first power supply terminal, but not limited thereto.

In one or more embodiments, in the first output stage, the fourth transistor M4 is turned on, and the first signal terminal S1 provides the same signal as the first power supply terminal VG1 so that the potential of the third node N3 is changed and is different from the potential of the first power supply terminal VG1. In an embodiment, the first power supply terminal VG1 provides a first low-level signal VGL1; and in the first output stage, the potential of the third node N3 is lower than the first low-level signal VGL1.

Figure 4:
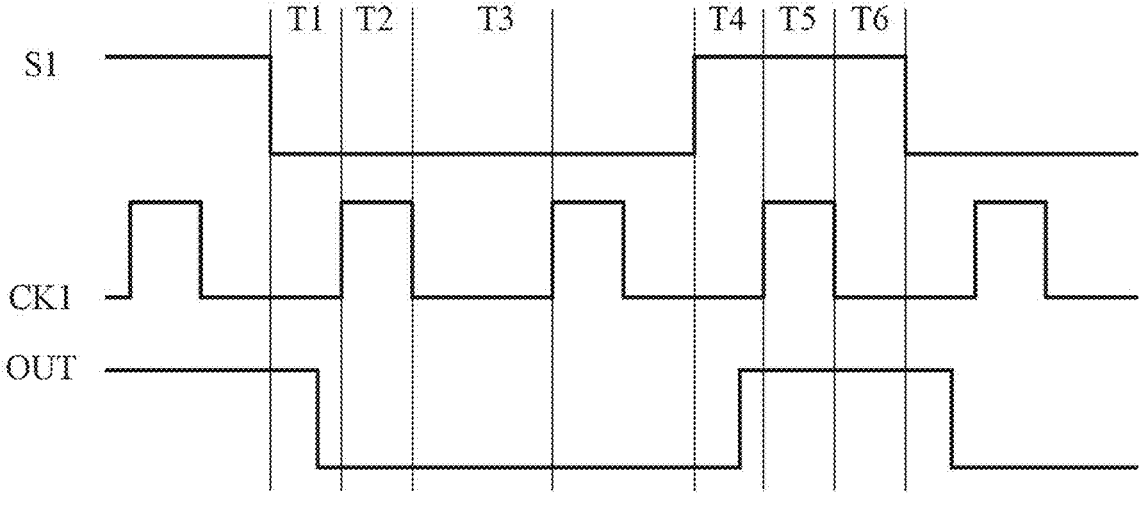
FIG. 4 is a timing diagram of the first shift register shown in FIG. 3.

FIG. 4 is a timing diagram of the first shift register shown in FIG. 3. As shown in FIG. 4, the working process of the first shift register includes at least time period T1, time period T2, time period T3, time period T4, time period T5 and time period T6.

In time period T1, CK1 provides a low-level signal so that M4 is turned on; the signal provided by S1 switches from a high level to the low-level VGL1 so that M7 is turned on, then the potential at the fourth node N4 is VGH, and M5 is turned off; the potential at the first node N1 is VGL1 so that M6 is turned on; the potential at the second node N2 is VGH, and M3 is turned off; S2 provides the low-level signal VGL2 slightly higher than VGL1 so that M1 is turned on, then the potential at the third node N3 is VGL1, M2 is turned on, and the potential of OUT switches from a high-level signal to VGL1. After coupling by C1, the potential at the third node N3 is pulled down from VGL1 to a potential lower than VGL1, thus a voltage difference Vgs between the source and the gate of M1 is changed so that M1 switches from the on state to the off state; the potential of the third node N3 is lower than VGL1, and M2 is stably in the on state. Exemplarily, VGL1 is −8V, and VGL2 is −7V.

In time period T2, S1 provides the low-level signal VGL1, M7 is turned on, the potential at the fourth node N4 is VGH, and M5 is turned off; the signal provided by CK1 switches from the low-level signal to the high-level signal so that M4 is turned off; the potential at the first node N1 is VGL1, M6 is turned on, the potential at the second node N2 is VGH, and M3 is turned off; M1 is turned off, the potential at the third node N3 is lower than VGL1, M2 is stably in the off state, and the potential of OUT is VGL1.

In time period T3, S1 provides the low-level signal VGL1, M7 is turned on, the potential at the fourth node N4 is VGH, and M5 is turned off; CK1 provides a low-level signal so that M4 is turned on; the potential at the first node N1 is VGL1, M6 is turned on; the potential at the second node N2 is VGH, M3 is turned off; M1 is turned off, the potential at the third node N3 is lower than VGL1, M2 is stably in the on state, and the potential of OUT is VGL1. The first output stage includes at least time period T3.

A gap exists between time period T4 and time period T3, the signal provided by S1 switches from the low-level signal VGL1 to the high-level signal, and M7 is turned off; CK1 provides a low-level signal so that M4 is turned on; the potential at the first node N1 is a high-level signal, M6 is turned off; after coupling by the third capacitor C3, the potential at the fourth node N4 switches from VGH to a low-level signal, M5 is turned on; the potential at the second node N2 is a low-level signal, M3 is turned on, and the potential of OUT switches from VGL1 to VGH; after coupling by capacitor C1, the potential at the third node N3 is slowly raised, and Vgs of M1 is changed so that M1 switches from the off state to the on state; the potential at the third node N3 switches to a high level, and M2 switches from the on state to the off state.

In time period T5, S1 provides a high-level signal, M7 is turned off; the signal provided by CK1 switches from a low-level signal to a high-level signal so that M4 is turned off; the potential at the first node N1 is a high-level signal, M6 is turned off; the potential at the fourth node N4 is a low-level signal, M5 is turned on; the potential at the second node N2 is a high-level signal, M3 is turned off; M1 is turned on, the potential at the third node N3 is a high-level signal, M2 is turned off, and the potential of OUT is VGH.

In time period T6, S1 provides a high-level signal, M7 is turned off; CK1 provides a low-level signal so that M4 is turned on; the potential at the first node N1 is a high-level signal, M6 is turned off; after coupling by the third capacitor C3, the potential at the fourth node N4 is a low-level signal, M5 is turned on; the potential at the second node N2 is a low-level signal, M3 is turned on; M1 is turned on, the potential at the third node N3 is a high-level signal, M2 is turned off, and the potential of OUT is VGH. The second output stage includes at least time period T6.

As described above, in the first output stage, the output signal terminal OUT of the first shift register 10 can stably output the signal VGL1 provided by the first power supply terminal VG1. In the second output stage, the output signal terminal OUT of the first shift register 10 can stably output the signal VGH provided by the second power supply terminal VG2. It is to be noted that current leakage exists in the transistor and threshold voltage drift may also occur.

In the embodiment, the gate of the first transistor M1 is connected to the second signal terminal S2, and the on/off state of the first transistor M1 can be effectively controlled by controlling the magnitude of the signal of the second signal terminal S2. In the first output stage, Vgs of the first transistor M1 is adjusted so that signal VGL2 of the second signal terminal S2 controls the first transistor M1 to be stabilized at the off state. Even if current leakage and threshold voltage drift occur on the first transistor M1, the off state can control the current leakage of the first transistor M1 to a relatively low level. Therefore, the impact of the current leakage and the threshold voltage drift of the first transistor M1 on the third node N3 is effectively reduced so that the potential of the third node N3 is almost not raised or the raising amount of the potential is slight, and thus the on/off state of the second transistor M2 is not affected. In this manner, the stability of the output signal of the first shift register 10 in the first output stage is ensured under different driving states such as a low-frequency driving state or a high-frequency driving state.

The gate of the first transistor M1 is connected to the second signal terminal S2, and the on/off state of the first transistor M1 can be effectively controlled by controlling the magnitude of the signal of the second signal terminal S2. In the second output stage, Vgs of the first transistor M1 is adjusted so that signal VGL2 of the second signal terminal S2 controls the first transistor M1 to be stabilized at the on state, and thus the potential of the third node N3 can be stabilized so that the second transistor M2 is stabilized in the off state by the third node N3. In this manner, the stability of the output signal of the first shift register 10 in the second output stage is ensured under different driving states such as a low-frequency driving state or a high-frequency driving state.

It is to be noted that the timing diagram shown in FIG. 4 is only an example, and relevant staff may reasonably design the cycle, pulse width, signal magnitude and the like of each signal according to product requirements, which is not limited to the case shown in FIG. 4.

Figure 5:
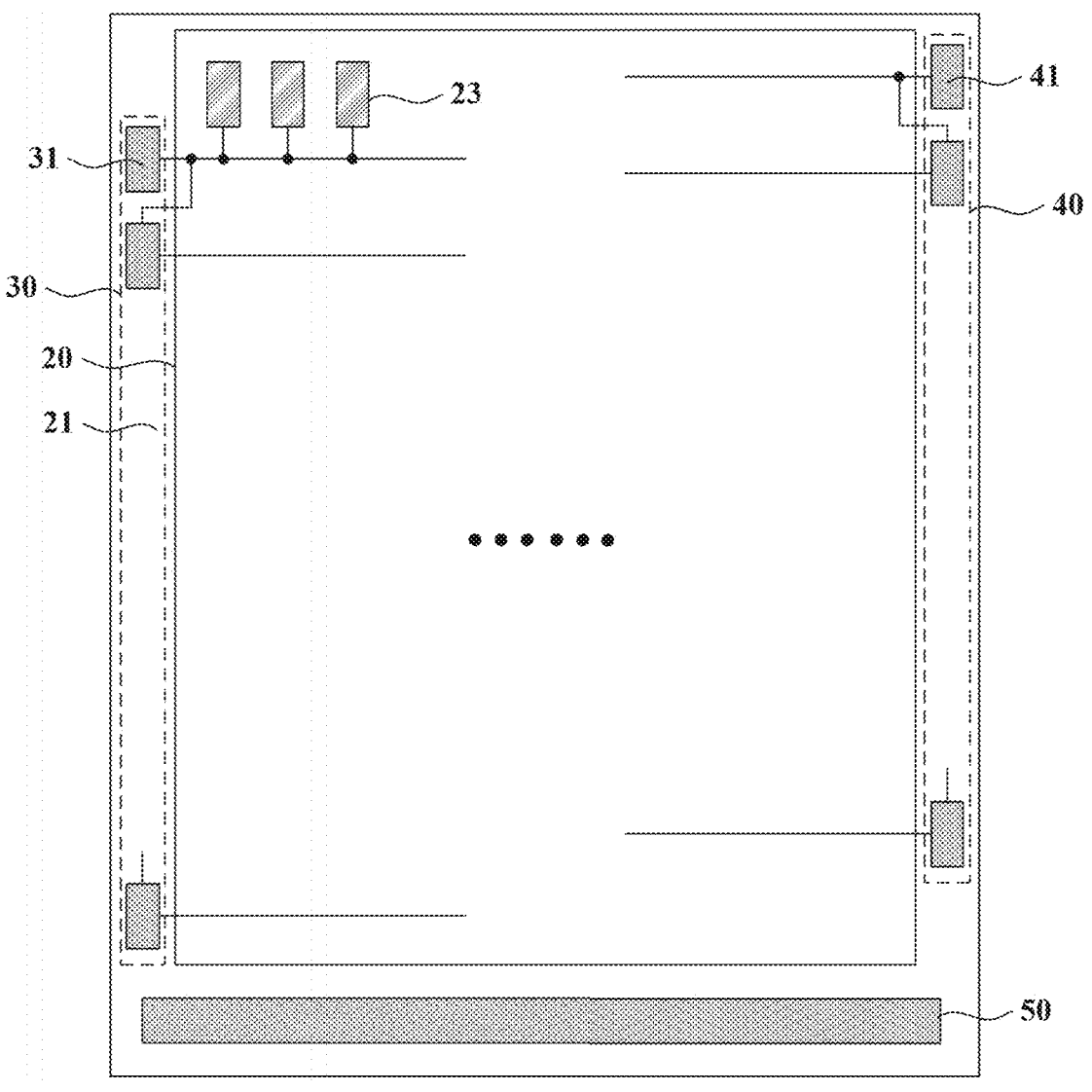
FIG. 5 is a diagram of another display panel according to an embodiment of the present disclosure.

FIG. 5 is a diagram of another display panel according to an embodiment of the present disclosure. As shown in FIG. 5, in an embodiment, the display panel includes a display region 20 and a non-display region 21. The display region 20 includes pixel circuits 23. The non-display region 21 includes a first driver circuit 30, the first driver circuit 30 includes multiple cascaded stages of first shift registers 31, and an output signal terminal of one stage first shift register 31 in the first driver circuit 30 provides a first drive signal for at least one row of pixel circuits 23 in the display region 20. The first shift register 31 is the first shift register described in any one of the preceding embodiments. The first driver circuit in the display panel uses the first shift register described in any one of the preceding embodiments so that the stability of the output signal of the first driver circuit can be improved, and thereby the display effect can be improved.

In an embodiment, the output signal terminal of the current stage first shift register 31 in the first driver circuit 30 is connected to the first signal terminal of the next stage first shift register 31. In an embodiment, the output signal terminal of one stage first shift register 31 provides the first drive signal for one row of pixel circuits 23 in the display region 20. However, in other embodiments, the output signal terminal of one stage first shift register provides the first drive signal for two adjacent rows of pixel circuits in the display region, which is not limited herein.

As shown in FIG. 5, in an embodiment, the non-display region 21 further includes a second driver circuit 40. The second driver circuit 40 includes first shift registers 41 cascaded in multiple stages, and an output signal terminal of one stage first shift register 41 in the second driver circuit 40 provides a second drive signal for at least one row of pixel circuits 23 in the display region 20. The first shift register 41 is the first shift register described in any one of the preceding embodiments. The second driver circuit in the display panel uses the first shift register described in any one of the preceding embodiments so that the stability of the output signal of the second driver circuit can be improved, and thereby the display effect can be improved.

It is to be noted that the first driver circuit 30 and the second driver circuit 40 may be disposed on the same side of the display panel, or as shown in FIG. 5, the first driver circuit 30 and the second driver circuit 40 may be disposed on different sides of the display panel. The first driver circuit 30 may be driven in a bilateral driving mode or a unilateral driving mode, and the second driver circuit 40 may be driven in a bilateral driving mode or a unilateral driving mode, which are not limited herein.

The first driver circuit 30 and the second driver circuit 40 are both driver circuits in the non-display region 21 for driving pixel circuits 23. In an embodiment, the first driver circuit 30 and the second driver circuit 40 provide drive signals for different functional modules of the pixel circuits 23.

Figure 6:
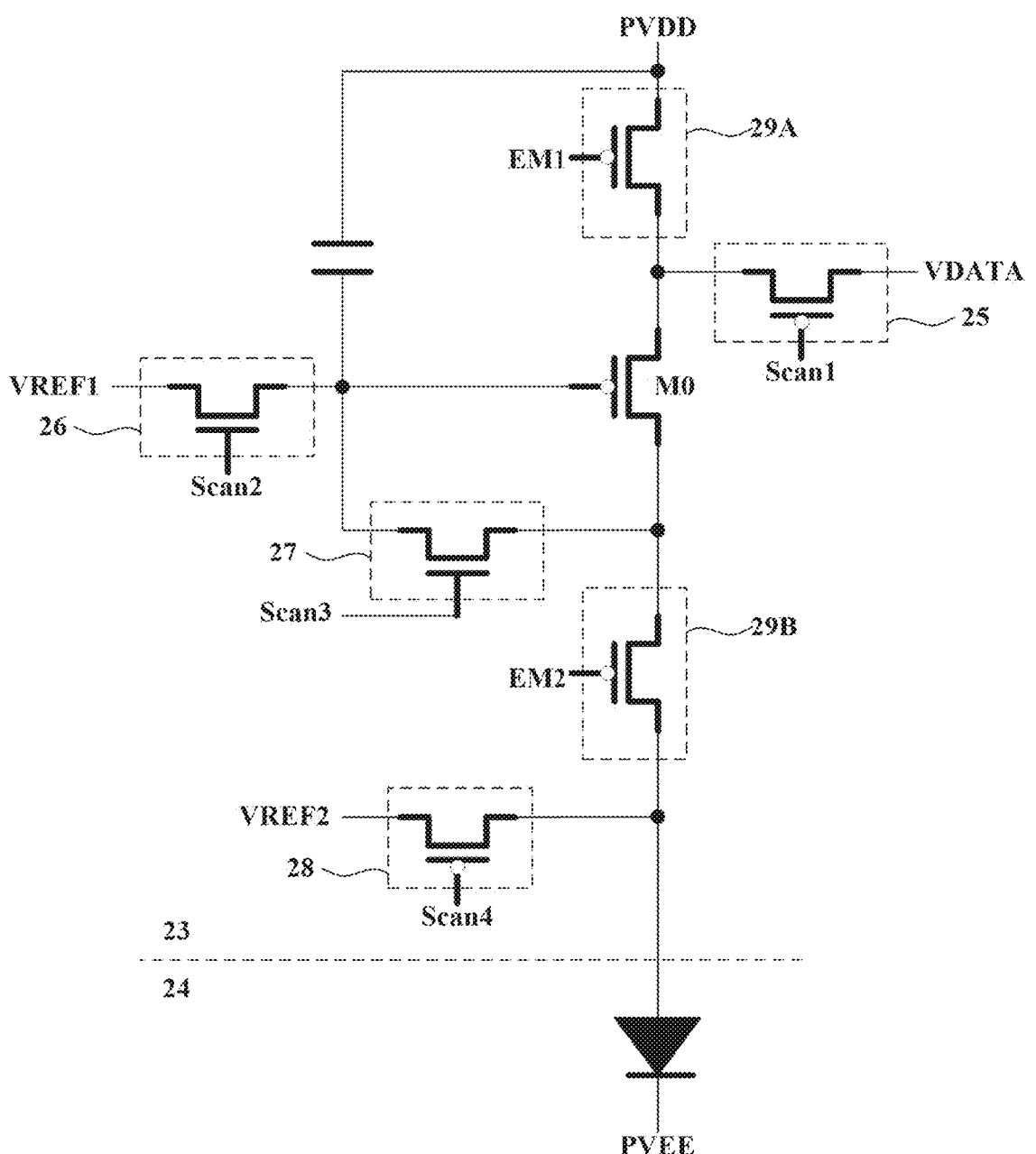
FIG. 6 is a diagram of a pixel circuit according to an embodiment of the present disclosure.

FIG. 6 is a diagram of a pixel circuit according to an embodiment of the present disclosure. As shown in FIG. 6, a pixel circuit 23 is connected to a light-emitting element 24. The pixel circuit 23 includes multiple functional modules. The multiple functional modules include at least a data write module 25, a reset module 26, a compensation module 27, an initialization module 28, a first dimming module 29A and a second dimming module 29B.

The data write module 25 is connected between a data signal terminal VDATA and a first terminal of a drive transistor M0, and a control terminal of the data write module 25 is connected to a scan line Scan1. The reset module 26 is connected between a first reset signal terminal VREF1 and a gate of the drive transistor M0, and a control terminal of the reset module 26 is connected to a scan line Scan2. The compensation module 27 is connected between the gate of the drive transistor M0 and a second terminal of the drive transistor M0, and a control terminal of the compensation module 27 is connected to a scan line Scan3. The initialization module 28 is connected between a second reset signal terminal VREF2 and a first electrode of the light-emitting element 24, and a control terminal of the initialization module 28 is connected to a scan line Scan4. The first dimming module 29A, the drive transistor M0, the second dimming module 29B and the light-emitting element 24 are connected in series. An input terminal of the first dimming module 29A is connected to the power supply terminal PVDD, a control terminal of the first dimming module 29A is connected to a first dimming control line EM1, a control terminal of the second dimming module 29B is connected to a second dimming control line EM2, and a second electrode of the light-emitting element 24 is connected to the power supply terminal PVEE.

In one or more embodiments, the output signal terminal of the first shift register 31 in the first driver circuit 30 is connected to the scan line Scan1 to control the on/off state of the data write module 25 in the pixel circuit 23. Alternatively, the output signal terminal of the first shift register 31 in the first driver circuit 30 is connected to the scan line Scan2 to control the on/off state of the reset module 26 in the pixel circuit 23. Alternatively, the output signal terminal of the first shift register 31 in the first driver circuit 30 is connected to the scan line Scan3 to control the on/off state of the compensation module 27 in the pixel circuit 23. Alternatively, the output signal terminal of the first shift register 31 in the first driver circuit 30 is connected to the scan line Scan4 to control the on/off state of the initialization module 28 in the pixel circuit 23. Alternatively, the output signal terminal of the first shift register 31 in the first driver circuit 30 is connected to the first dimming control line EM1 to control the on/off state of the first dimming module 29A in the pixel circuit 23. Alternatively, the output signal terminal of the first shift register 31 in the first driver circuit 30 is connected to the second dimming control line EM2 to control the on/off state of the second dimming module 29B in the pixel circuit 23.

Similarly, in an embodiment, the output signal terminal of the first shift register 41 in the second driver circuit 40 is connected to any signal line among the scan line Scan1, the scan line Scan2, the scan line Scan3, the scan line Scan4, the first dimming control line EM1 and the second dimming control line EM2 to control the on/off state of the corresponding functional module in the pixel circuit 23.

It is to be understood that the first driver circuit 30 and the second driver circuit 40 provide drive signals for different functional modules in the pixel circuit 23 so that according to working requirements of different functional modules in the pixel circuit 23, the first drive signal provided by the first shift register 31 in the first driver circuit 30 may be different from the second drive signal provided by the first shift register 41 in the second driver circuit 40. Exemplarily, the output signal terminal of the first shift register 31 in the first driver circuit 30 is connected to the first dimming control line EM1, and the output signal terminal of the first shift register 41 in the second driver circuit 40 is connected to scan line Scan1. Therefore, the first drive signal is an invalid pulse signal in a pre-stage of the pixel circuit 23 so that the first dimming module 29A is turned off, and the second drive signal is a valid pulse signal during the time period of the pre-stage of the pixel circuit 23 so that the data write module 25 is turned on.

On this basis, the working timing of the first shift register 31 in the first driver circuit 30 and the working timing of the first shift register 41 in the second driver circuit 40 are adjusted reasonably according to product requirements and are not limited to the preceding illustrations. In addition, the pixel circuit shown in FIG. 6 is only an example, and the structure of the pixel circuit is not limited to 7T1C structure shown in FIG. 6.

Referring to FIG. 1 and FIG. 5, in an embodiment, the non-display region 21 further includes a display chip 50. The display chip 50 is configured to provide a voltage signal for the second signal terminal S2 of the first shift register (31, 41). In the embodiment, the peripheral lines of the non-display region 21 further include the display chip 50. The display chip 50 provides a voltage signal for the second signal terminal S2 of the first shift register (31, 41). It is to be understood that the display chip 50 may further provide a voltage signal for the first power supply terminal VG1 of the first shift register (31, 41), the display chip 50 may further provide a voltage signal for the second power supply terminal VG2 of the first shift register (31, 41), etc. The first shift register (31, 41) drives the pixel circuit 23 in the display region 20 under the control of the display chip 50.

In one or more embodiments, the display chip 50 provides different voltage signals for second signal terminals S2 of at least two first shift registers 31 in the first driver circuit 30; and/or the display chip 50 provides different voltage signals for second signal terminals S2 of at least two first shift registers 41 in the second driver circuit 40.

In the embodiment, according to different display requirements, the display chip 50 may provide different voltage signals for second signal terminals S2 of at least two first shift registers 31 in the first driver circuit 30 to satisfy the display requirements in different display situations. According to different display requirements, the display chip 50 may provide different voltage signals for second signal terminals S2 of at least two first shift registers 41 in the second driver circuit 40 to satisfy display requirements in different display situations.

The display chip 50 flexibly controls the magnitude of the voltage signal provided for the second signal terminal S2 of each first shift register according to display requirements so that different display requirements for the display panel can be satisfied, and the display effect is improved.

Referring to FIG. 5 and FIG. 6, the first drive signal is different from the second drive signal. The voltage signal provided by the display chip 50 for the second signal terminal S2 in the first driver circuit 30 is different from the voltage signal provided by the display chip 50 for the second signal terminal S2 in the second driver circuit 40.

In the embodiment, the first drive signal provided by the output signal terminal of the first shift register 31 in the first driver circuit 30 is different from the second drive signal provided by the output signal terminal of the first shift register 41 in the second driver circuit 40.

In one or more embodiments, the output signal terminal of the first shift register 31 in the first driver circuit 30 is connected to the first dimming control line EM1, and the output signal terminal of the first shift register 41 in the second driver circuit 40 is connected to the scan line Scan1. Therefore, the first drive signal is different from the second drive signal. At this time, the display chip 50 flexibly controls the magnitude of the voltage signal provided for the second signal terminal S2 of the first shift register 31 in the first driver circuit 30 and also flexibly controls the magnitude of the voltage signal provided for the second signal terminal S2 of the first shift register 41 in the second driver circuit 40 according to display requirements, so that the first driver circuit 30 and the second driver circuit 40 can achieve display driving, and thus the normal display of the display panel is ensured.

It is to be understood that the output signal terminal of the first shift register 31 in the first driver circuit 30 and the output signal terminal of the first shift register 41 in the second driver circuit 40 may be connected to the same functional module of the pixel circuit 23. At this time, the first driver circuit 30 and the second driver circuit 40 form a bilateral driving mode; therefore, the first drive signal provided by the output signal terminal of the first shift register 31 in the first driver circuit 30 may be equal to the second drive signal provided by the output signal terminal of the first shift register 41 in the second driver circuit 40. On this basis, the display chip 50 can flexibly control the magnitude of the voltage signal provided for the second signal terminal S2 of the first shift register 41 in the second driver circuit 40, and can also flexibly control the magnitude of the voltage signal provided for the second signal terminal S2 of the first shift register 31 in the first driver circuit 30. In this manner, different display requirements for the display panel, such as high-frequency display, low-frequency display and frequency division display, can be satisfied.

Figure 7:
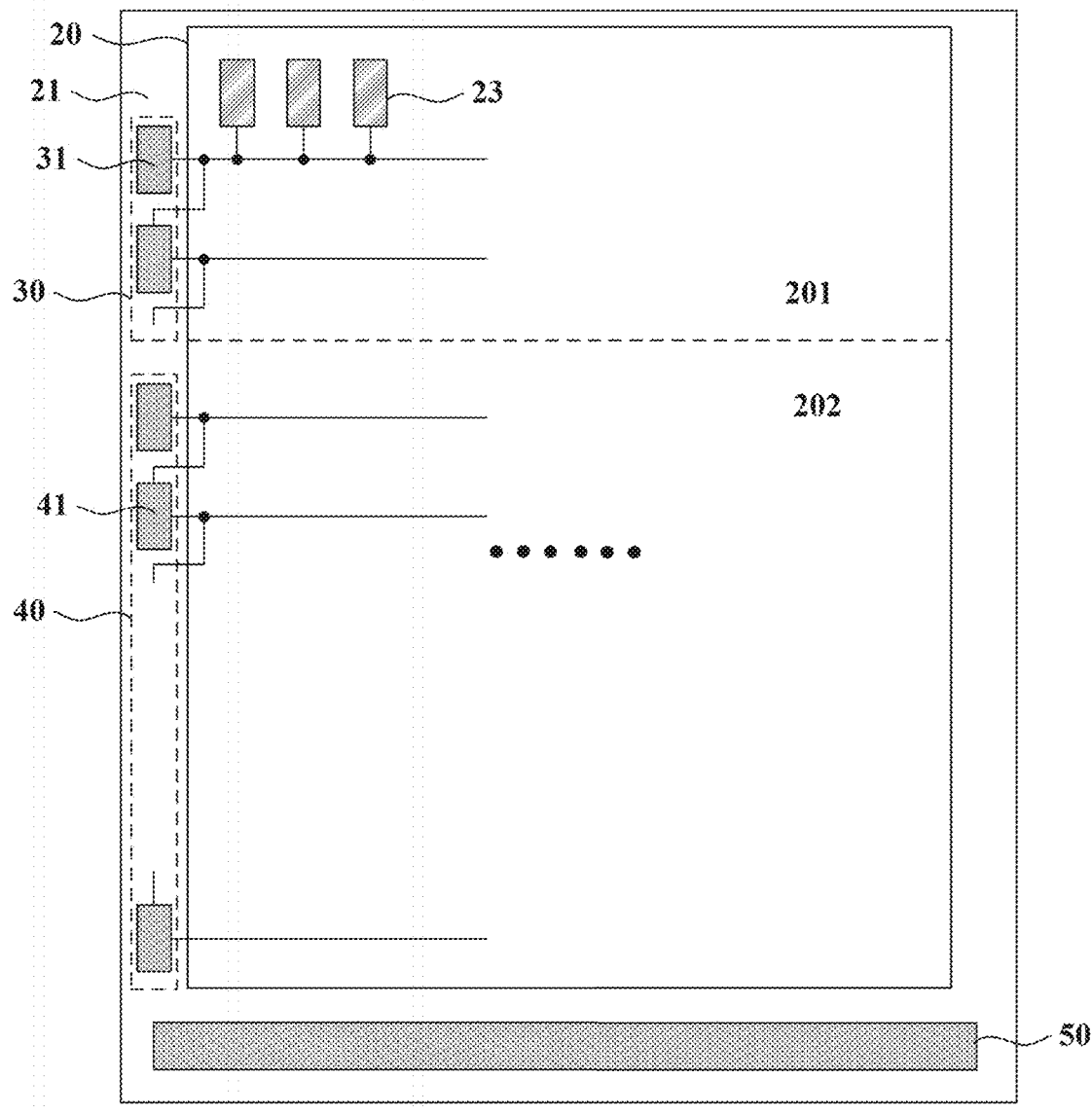
FIG. 7 is a diagram of another display panel according to an embodiment of the present disclosure.

FIG. 7 is a diagram of another display panel according to an embodiment of the present disclosure. As shown in FIG. 7, in an embodiment, the display region 20 includes a first region 201 and a second region 202. The first driver circuit 30 provides a first drive signal for various rows of pixel circuits 23 of the first region 201 in the display region 20, and the second driver circuit 40 provides a second drive signal for various rows of pixel circuits 23 of the second region 202 in the display region 20.

In the embodiment, the display region 20 includes the first region 201 and the second region 202, and display requirements for the first region 201 and display requirements for the second region 202 may be the same or different. At this time, the first driver circuit 30 provides the first drive signal for various rows of pixel circuits 23 of the first region 201 in the display region 20 to drive the first region 201. The second driver circuit 40 provides the second drive signal for various rows of pixel circuits 23 of the second region 202 in the display region 20 to drive the second region 202. The first driver circuit 30 and the second driver circuit 40 provide different drive signals for pixel circuits 23 of different regions in the display region 20 so that display requirements for different regions in the display region 20 can be satisfied.

In one or more embodiments, the first region 201 is a high-frequency display region and the second region 202 is a low-frequency display region, then the display chip 50 controls the first driver circuit 30 to provide the corresponding first drive signal for various rows of pixel circuits 23 in the first region 201, and the display chip 50 controls the second driver circuit 40 to provide the corresponding second drive signal for various rows of pixel circuits 23 in the second region 202.

In one or more embodiments, the first drive signal and the second drive signal are each a dimming control signal. Brightness of the first region is different from brightness of the second region, and the display chip is configured to adjust the voltage signal of the second signal terminal of the first driver circuit according to the brightness of the first region and adjust the voltage signal of the second signal terminal of the second driver circuit according to the brightness of the second region.

Referring to FIG. 6 and FIG. 7, in an embodiment, the first dimming control line EM1 and the second dimming control line EM2 in the pixel circuit 23 are connected to the output signal terminal of the same first shift register.

In the first driver circuit 30, the output signal terminal of one stage first shift register 31 is connected to the control terminals of the first dimming modules and the control terminals of the second dimming modules of one row of pixel circuits 23 in the first region 201. The first drive signal provided by the output signal terminal of the first shift register 31 is the dimming control signal used for controlling the two corresponding connected dimming modules of one pixel circuit 23 to be turned on or off simultaneously.

In the second driver circuit 40, the output signal terminal of one stage first shift register 41 is connected to the control terminals of the first dimming modules and the control terminals of the second dimming modules of one row of pixel circuits 23 in the second region 202. The second drive signal provided by the output signal terminal of the first shift register 41 is the dimming control signal used for controlling the two corresponding connected dimming modules of the pixel circuit 23 to be turned on or off simultaneously.

If the brightness of the first region 201 is different from the brightness of the second region 202, the display chip 50 adjusts the voltage signal of the second signal terminal S2 of the first shift register 31 in the first driver circuit 30 according to the brightness of the first region 201 so that the first driver circuit 30 provides the required drive signal for two dimming modules of various rows of pixel circuits 23 in the first region 201 to control the on/off state of the two dimming modules.

The display chip 50 further adjusts the voltage signal of the second signal terminal S2 of the first shift register 41 in the second driver circuit 40 according to the brightness of the second region 202, so that the second driver circuit 40 provides the required drive signal for two dimming modules of various rows of pixel circuits 23 in the second region 202 to control the on/off state of the two dimming modules.

The display chip 50 flexibly adjusts the magnitude of the voltage signal provided for the second signal terminal S2 of the first shift register 31 in the first driver circuit 30 and also flexibly adjusts the magnitude of the voltage signal provided for the second signal terminal S2 of the first shift register 41 in the second driver circuit 40 according to the brightness of the first region 201 and the second region 202, so that display requirements for different regions in the display region can be satisfied, and the display effect is improved.

It is to be noted that the brightness of the first region 201 is different from the brightness of the second region 202, so the light emission duration of pixel circuits 23 in the first region 201 is different from the light emission duration of pixel circuits 23 in the second region 202. On this basis, the duty cycle of the dimming control signal transmitted by the dimming control line in the first region 201 is different from the duty cycle of the dimming control signal transmitted by the dimming control line in the second region 202. The light emission duration of the pixel circuits 23 in the first region 201 and the light emission duration of the pixel circuits 23 in the second region 202 can be adjusted. The display chip 50 adjusts the voltage signal of the second signal terminal S2 in the first driver circuit 30 according to the brightness of the first region 201 and adjusts the voltage signal of the second signal terminal S2 in the second driver circuit 40 according to the brightness of the second region 202, so that the brightness of the first region 201 and the brightness of the second region 202 can be flexibly controlled.

In one or more embodiments, the display panel includes S frames. At least two frames have different durations, and S>1. During two frames having different durations, the display chip provides different voltage signals for the second signal terminal of the same first shift register.

In the embodiment, at least two frames have different durations. The time of one frame is adjusted relative to the previous frame, and correspondingly, dimming control signals of the two frames are also different. On this basis, the duty cycle of the dimming control signal transmitted by the dimming control line may be different for the two frames. The display chip 50 adjusts the voltage signal of the second signal terminal S2 of the first shift register according to the duration of each frame so that the display chip may provide different voltage signals for the second signal terminal of the same first shift register in two frames with different durations, satisfying display requirements of different frames.

Figure 8:
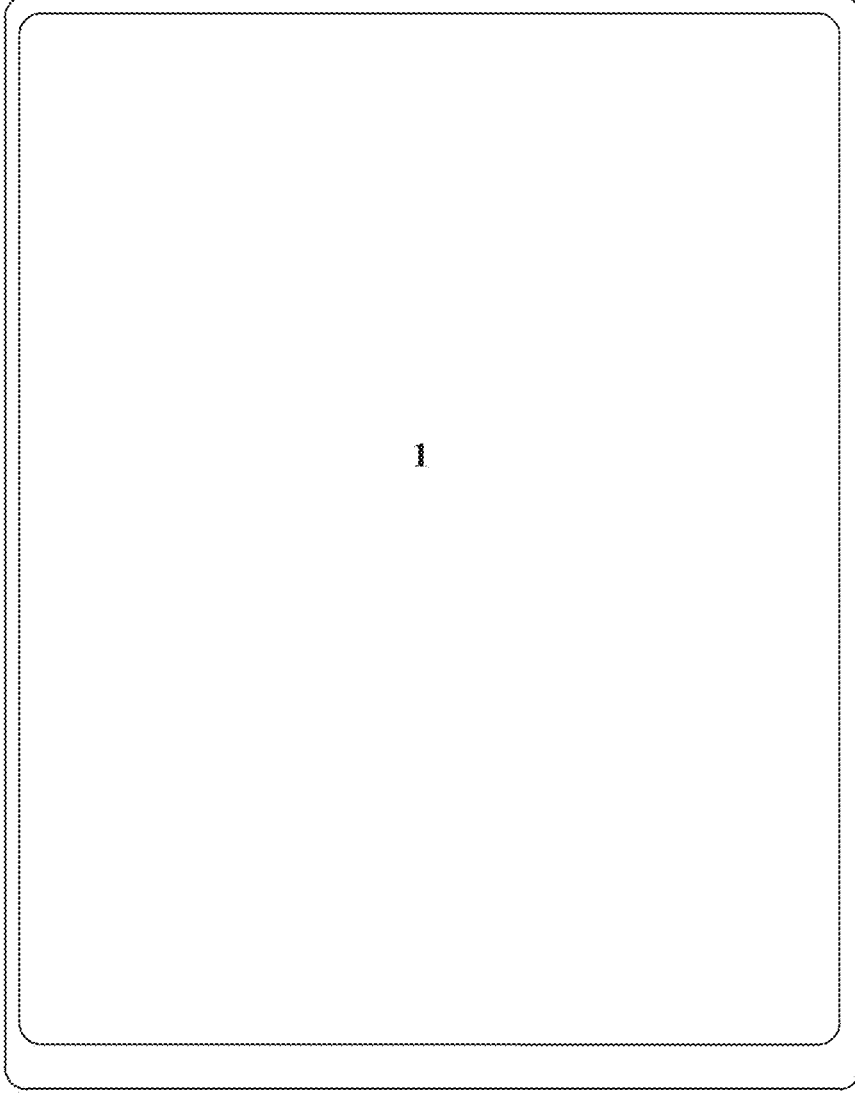
FIG. 8 is a diagram of a display device according to an embodiment of the present disclosure.

Based on the same inventive concept, an embodiment of the present disclosure further provides a display device. The display device includes the preceding display panel. In an embodiment, the display panel is an organic light-emitting display panel or a micro light-emitting diode (LED) display panel. FIG. 8 is a diagram of a display device according to an embodiment of the present disclosure. As shown in FIG. 8, in an embodiment, the display device is applied to an electronic device 1 such as a smart phone and a tablet computer. It is to be understood that the preceding embodiments merely provide partial structures of the display panel, the shift register and the pixel circuit, and the display panel further includes other structures, which will not be repeated herein.

The preceding embodiments do not limit the scope of the present disclosure. It is to be understood by those skilled in the art that various modifications, combinations, sub-combinations and substitutions may be performed according to design requirements and other factors. Any modification, equivalent substitution, improvement or the like made within the spirit and principle of the present disclosure is within the scope of the present disclosure.

What is claimed is:

1. A display panel, comprising: first shift registers, wherein a first shift register of the first shift registers comprises: a node control module, a first control module, a first output module, and a second output module;

wherein the node control module is connected to a first signal terminal, a first clock signal terminal, a first node and a second node, and the node control module is configured to control a potential of the first node and a potential of the second node; a control terminal of the first control module is connected to a second signal terminal, and the first control module is connected between the first node and a third node; a control terminal of the first output module is connected to the third node, and the first output module is connected between a first power supply terminal and an output signal terminal; and a control terminal of the second output module is connected to the second node, and the second output module is connected between a second power supply terminal and the output signal terminal;

wherein a working stage of the first shift register comprises a first output stage, wherein in the first output stage, the node control module adjusts the potential of the first node and the potential of the second node so that the first output module is turned on, the second output module is turned off and the first control module is turned off;

wherein the node control module comprises a fourth transistor, wherein a gate of the fourth transistor is connected to the first clock signal terminal, and the fourth transistor is connected between the first signal terminal and the first node; and the first signal terminal provides signals alternating between a high level and a low level; wherein in the first output stage, the fourth transistor is turned on, and the first signal terminal provides a same signal as the first power supply terminal so that a potential of the third node is changed and is different from a potential of the first power supply terminal; and/or the first power supply terminal is configured to provide a constant voltage signal.

2. The display panel according to claim 1, wherein the first control module comprises a first transistor, wherein a gate of the first transistor is connected to the second signal terminal, and the first transistor is connected between the first node and the third node.

3. The display panel according to claim 1, wherein the first output module comprises a second transistor and a first capacitor, wherein a gate of the second transistor is connected to the third node, and the second transistor is connected between the first power supply terminal and the output signal terminal; and the first capacitor is coupled between the third node and the output signal terminal.

4. The display panel according to claim 1, wherein the second output module comprises a third transistor and a second capacitor, wherein a gate of the third transistor is connected to the second node, and the third transistor is connected between the second power supply terminal and the output signal terminal; and the second capacitor is coupled between the second node and the second power supply terminal.

5. The display panel according to claim 1, wherein a voltage signal provided by the second signal terminal is different from a voltage signal provided by the first power supply terminal.

6. The display panel according to claim 5, wherein the first power supply terminal provides a first low-level signal, the second signal terminal provides a second low-level signal, and the first low-level signal is not equal to the second low-level signal.

7. The display panel according to claim 6, wherein the first low-level signal is lower than the second low-level signal.

8. The display panel according to claim 1, wherein the first power supply terminal provides a first low-level signal; and in the first output stage, the potential of the third node is lower than the first low-level signal.

9. The display panel according to claim 1, wherein the working stage of the first shift register further comprises a second output stage, wherein in the second output stage, the node control module adjusts the potential of the first node and the potential of the second node so that the first output module is turned off and the second output module is turned on.

10. The display panel according to claim 1, wherein the first power supply terminal provides a low-level signal, and the second power supply terminal provides a high-level signal.

11. A display device, comprising a display panel, wherein the display panel comprises: first shift registers, wherein a first shift register of the first shift registers comprises: a node control module, a first control module, a first output module, and a second output module, wherein the node control module is connected to a first signal terminal, a first clock signal terminal, a first node and a second node, and the node control module is configured to control a potential of the first node and a potential of the second node; a control terminal of the first control module is connected to a second signal terminal, and the first control module is connected between the first node and a third node; a control terminal of the first output module is connected to the third node, and the first output module is connected between a first power supply terminal and an output signal terminal; and a control terminal of the second output module is connected to the second node, and the second output module is connected between a second power supply terminal and the output signal terminal;

wherein a working stage of the first shift register comprises a first output stage, wherein in the first output stage, the node control module adjusts the potential of the first node and the potential of the second node so that the first output module is turned on, the second output module is turned off and the first control module is turned off;

wherein the node control module comprises a fourth transistor, wherein a gate of the fourth transistor is connected to the first clock signal terminal, and the fourth transistor is connected between the first signal terminal and the first node; and the first signal terminal provides signals alternating between a high level and a low level;

wherein in the first output stage, the fourth transistor is turned on, and the first signal terminal provides a same signal as the first power supply terminal so that a potential of the third node is changed and is different from a potential of the first power supply terminal; and/or the first power supply terminal is configured to provide a constant voltage signal.

12. A display panel, comprising: first shift registers, a display region and a non-display region, wherein a first shift register of the first shift registers comprises: a node control module, a first control module, a first output module, and a second output module;

wherein the node control module is connected to a first signal terminal, a first clock signal terminal, a first node and a second node, and the node control module is configured to control a potential of the first node and a potential of the second node; a control terminal of the first control module is connected to a second signal terminal, and the first control module is connected between the first node and a third node; a control terminal of the first output module is connected to the third node, and the first output module is connected between a first power supply terminal and an output signal terminal; and a control terminal of the second output module is connected to the second node, and the second output module is connected between a second power supply terminal and the output signal terminal;

wherein a working stage of the first shift register comprises a first output stage, wherein in the first output stage, the node control module adjusts the potential of the first node and the potential of the second node so that the first output module is turned on, the second output module is turned off and the first control module is turned off;

wherein the display region comprises pixel circuits; and the non-display region comprises a first driver circuit, the first driver circuit comprises a plurality of cascaded stages of first shift registers, and an output signal terminal of one stage first shift register in the first driver circuit provides a first drive signal for at least one row of pixel circuits in the display region;

wherein the non-display region further comprises a second driver circuit, the second driver circuit comprises a plurality of cascaded stages of first shift registers, and an output signal terminal of one stage first shift register in the second driver circuit provides a second drive signal for at least one row of pixel circuits in the display region;

wherein the non-display region further comprises a display chip, wherein the display chip is configured to provide a voltage signal for a second signal terminal of a first shift register in the first driver circuit, and/or for a second signal terminal of a first shift register in the second driver circuit; and wherein the display chip provides different voltage signals for second signal terminals of at least two first shift registers in the first driver circuit; and/or the display chip provides different voltage signals for second signal terminals of at least two first shift registers in the second driver circuit.

13. The display panel according to claim 12, wherein the first drive signal is different from the second drive signal; and a voltage signal provided by the display chip for the second signal terminal in the first driver circuit is different from a voltage signal provided by the display chip for the second signal terminal in the second driver circuit.

14. The display panel according to claim 12, wherein the display region comprises a first region and a second region;

the first driver circuit is configured to provide the first drive signal for each row of pixel circuits in the first region of the display region; and the second driver circuit is configured to provide the second drive signal for each row of pixel circuits in the second region of the display region.

15. The display panel according to claim 14, wherein the first drive signal and the second drive signal are each a dimming control signal; and brightness of the first region is different from brightness of the second region, and the display chip is configured to adjust a voltage signal of the second signal terminal in the first driver circuit according to the brightness of the first region and adjust a voltage signal of the second signal terminal in the second driver circuit according to the brightness of the second region.

16. The display panel according to claim 12, comprising S frames, wherein at least two frames of the S frames have different durations, and S>1; and for two of the at least two frames, the display chip provides different voltage signals for the second signal terminal of a same first shift register.

17. The display panel according to claim 12, wherein the first control module comprises a first transistor, wherein a gate of the first transistor is connected to the second signal terminal, and the first transistor is connected between the first node and the third node.

18. The display panel according to claim 12, wherein the first output module comprises a second transistor and a first capacitor, wherein a gate of the second transistor is connected to the third node, and the second transistor is connected between the first power supply terminal and the output signal terminal; and the first capacitor is coupled between the third node and the output signal terminal.

19. The display panel according to claim 12, wherein the second output module comprises a third transistor and a second capacitor, wherein a gate of the third transistor is connected to the second node, and the third transistor is connected between the second power supply terminal and the output signal terminal; and the second capacitor is coupled between the second node and the second power supply terminal.

20. The display panel according to claim 12, wherein a voltage signal provided by the second signal terminal is different from a voltage signal provided by the first power supply terminal.

21. The display panel according to claim 20, wherein the first power supply terminal provides a first low-level signal, the second signal terminal provides a second low-level signal, and the first low-level signal is not equal to the second low-level signal.

* * * * *